(12) United States Patent
Yoshikawa et al.

(10) Patent No.: US 7,399,682 B2
(45) Date of Patent: Jul. 15, 2008

(54) WAFER PROCESSING METHOD

(75) Inventors: Toshiyuki Yoshikawa, Tokyo (JP); Toshio Tsuchiya, Tokyo (JP)

(73) Assignee: Disco Corporation, Tokyo (JP)

( * ) Notice: Subject to any disclaimer, the term of this patent is extended or adjusted under 35 U.S.C. 154(b) by 394 days.

(21) Appl. No.: 11/147,245

(22) Filed: Jun. 8, 2005

(65) Prior Publication Data

US 2005/0277270 A1 Dec. 15, 2005

(30) Foreign Application Priority Data

Jun. 14, 2004 (JP) .............................. 2004-174978

(51) Int. Cl.
*H01L 21/66* (2006.01)
*H01L 21/00* (2006.01)
*H01L 21/30* (2006.01)
*H01L 21/469* (2006.01)

(52) U.S. Cl. .................... 438/463; 438/33; 438/113; 438/114; 438/458; 438/460; 438/463; 438/465; 438/758

(58) Field of Classification Search ................. None
See application file for complete search history.

(56) References Cited

U.S. PATENT DOCUMENTS

| | | | |
|---|---|---|---|
| 4,927,485 A * | 5/1990 | Cheng et al. ........... 156/345.25 |
| 5,366,905 A * | 11/1994 | Mukai ............................. 438/7 |
| 5,371,582 A * | 12/1994 | Toba et al. ..................... 356/73 |
| 6,406,924 B1 * | 6/2002 | Grimbergen et al. ........... 438/9 |
| 6,413,839 B1 * | 7/2002 | Brown et al. ................. 438/463 |
| 6,566,169 B1 * | 5/2003 | Uziel et al. ................... 438/115 |
| 6,881,687 B1 * | 4/2005 | Castrucci ..................... 438/795 |
| 6,905,624 B2 * | 6/2005 | Frum et al. .................... 216/60 |
| 2001/0014543 A1 * | 8/2001 | Chiba et al. ................... 438/758 |
| 2005/0067740 A1 * | 3/2005 | Haubensak ................. 264/400 |
| 2005/0202651 A1 * | 9/2005 | Akram ........................ 438/463 |

FOREIGN PATENT DOCUMENTS

| JP | 2003-320466 | 11/2003 |
|---|---|---|
| JP | 2005101416 | * 4/2005 |

* cited by examiner

*Primary Examiner*—Carl Whitehead, Jr.
*Assistant Examiner*—James M Mitchell
(74) *Attorney, Agent, or Firm*—Smith, Gambrell & Russell, LLP

(57) ABSTRACT

A wafer processing method for carrying out processing by applying a laser beam along streets formed on a wafer, comprising a step of applying a laser beam at an incident angle of a predetermined inclination angle to the normal line of a processing surface of the wafer while the wafer is processing-fed along a street from one end to the other end on the side of the laser beam application at an acute angle to the processing surface of the wafer.

4 Claims, 20 Drawing Sheets

Fig. 13
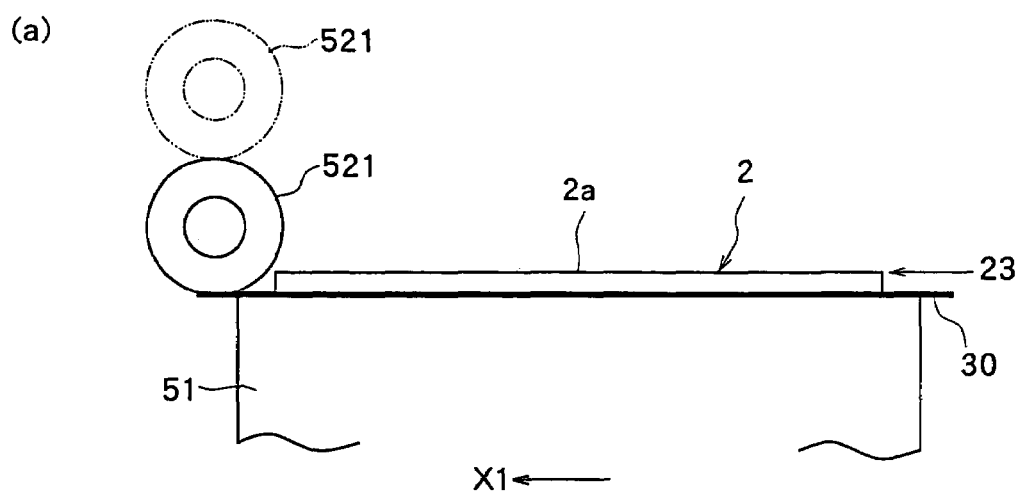
(a)
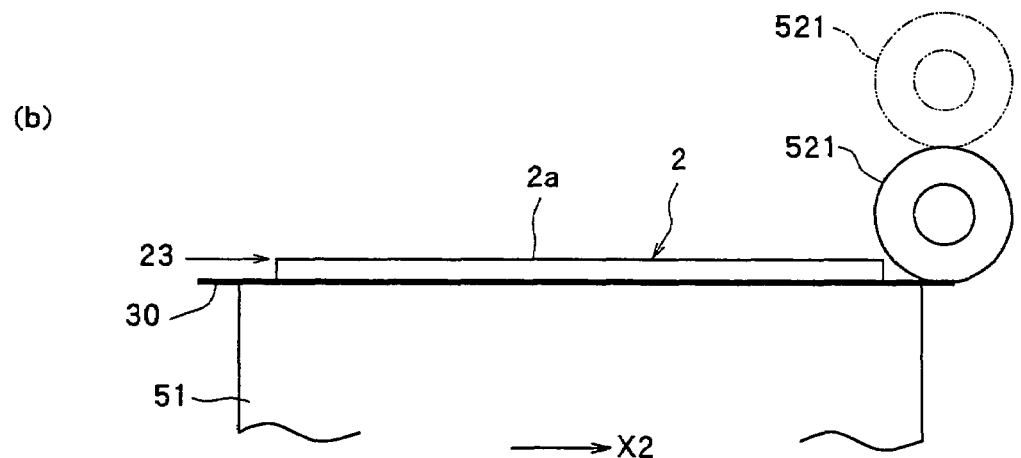
(b)

Fig. 14
(a)
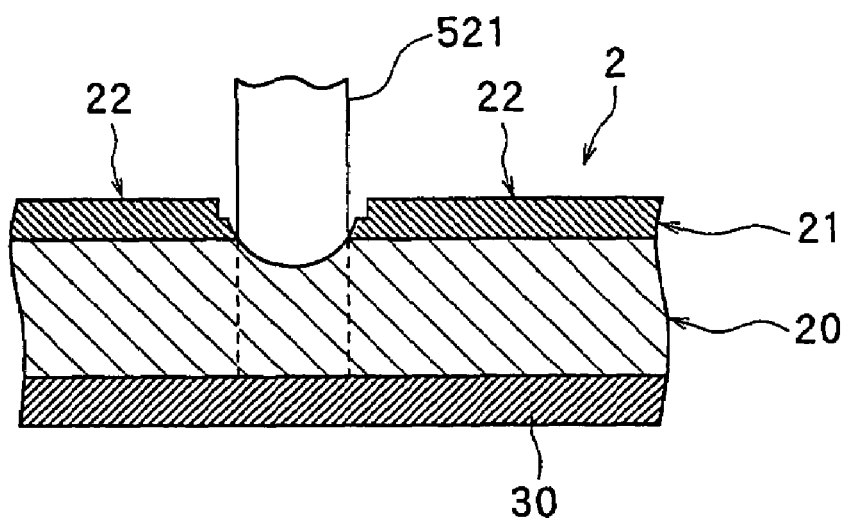
(b)
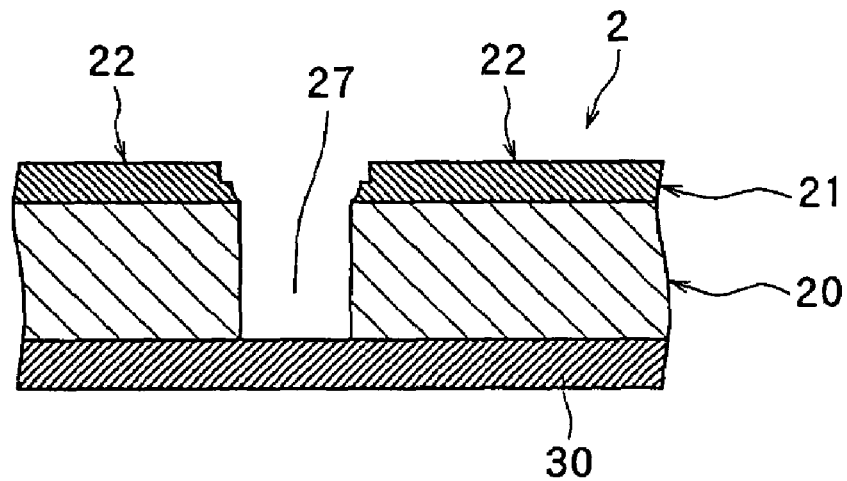

Fig. 20
(a)
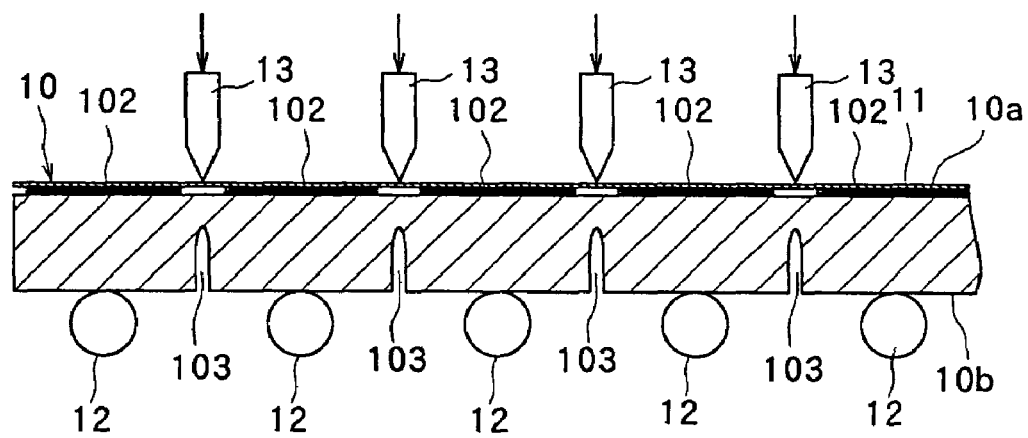
(b)
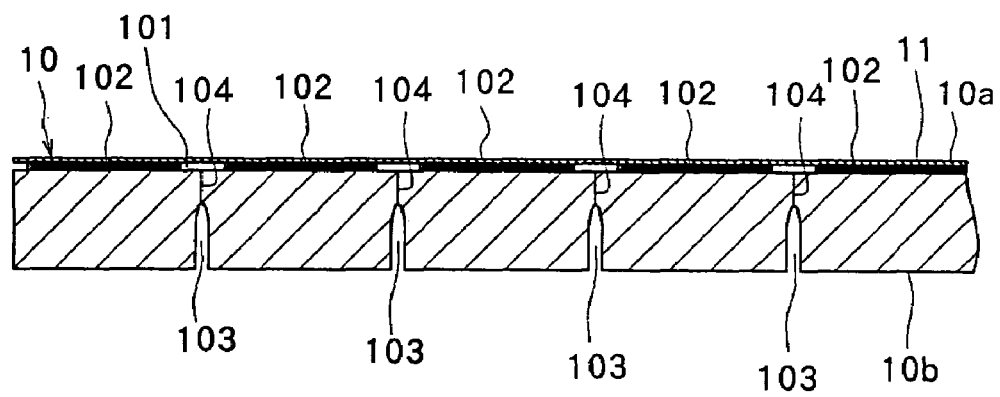

WAFER PROCESSING METHOD

FIELD OF THE INVENTION

The present invention relates to a wafer processing method for carrying out processing by applying a laser beam along streets formed on a wafer such as a semiconductor wafer or an optical device wafer.

DESCRIPTION OF THE PRIOR ART

As is known to people of ordinary skill in the art, a semiconductor wafer having a plurality of semiconductor chips such as IC's or LSI's, which are formed in a matrix on the front surface of a semiconductor substrate such as a silicon substrate and composed of a laminate consisting of an insulating film and a functional film, is formed in the production process of a semiconductor device. In the semiconductor wafer thus formed, the above semiconductor chips are sectioned by dividing lines called "streets", and individual semiconductor chips are manufactured by cutting the semiconductor wafer along the streets. An optical device wafer having optical devices comprising gallium nitride-based compound semiconductors in a plurality of areas which are sectioned by streets formed in a lattice pattern on the front surface of a sapphire substrate or the like is also divided into individual optical devices such as light emitting diodes or laser diodes along the streets. These optical devices are widely used in electric equipment.

Cutting along the streets of the wafer such as a semiconductor wafer or an optical device wafer is generally carried out with a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means has a rotary spindle that is rotated at a high speed, and a cutting blade mounted onto the spindle. The cutting blade comprises a disk-like base and an annular cutting edge that is mounted on the side wall peripheral portion of the base and formed as thick as about 20 µm by fixing diamond abrasive grains having a diameter of about 3 µm to the base by electroforming.

To improve the throughput of a semiconductor chip such as IC or LSI, a semiconductor wafer comprising semiconductor chips which are composed of a laminate consisting of a low-dielectric insulating film (Low-k film) formed of a film of an inorganic material such as SiOF or BSG (SiOB) or a film of an organic material such as a polyimide-based and parylene-based polymer and a functional film for forming circuits on the front surface of a semiconductor substrate such as a silicon substrate has recently been implemented.

A semiconductor wafer having a metal pattern called "test element group (TEG)", which is partially formed on the streets of the semiconductor wafer to check the function of each circuit before it is divided, has also been implemented.

It is difficult to cut the above Low-k film and test element group (TEG) at the same time with the cutting blade because they are formed of a material different from that of the wafer. That is, as the Low-k film is extremely fragile like mica, a problem occurs in that when the above semiconductor wafer is cut along the streets with the cutting blade, the Low-k film peels off, and this peeling reaches the circuits and causes a fatal damage to the semiconductor chips. Also, since the test element group (TEG) is formed of a metal, problems occur in that when the semiconductor wafer having the test element group (TEG) is cut with the cutting blade, a burr is produced and the service life of the cutting blade is shortened.

To solve the above problems, JP-A2003-320466 discloses a processing machine for removing the Low-k film for forming the streets and the test element group (TEG) formed on the streets by applying a laser beam along the streets of the semiconductor wafer and cutting the semiconductor wafer by positioning the cutting blade in the removed areas.

Since a laser beam is applied in a direction perpendicular to the processing surface of a workpiece to be processed when the workpiece is processed by applying a laser beam, molten debris from the point of processing where the laser beam is applied are scattered radially. This scattered debris accumulate in an unprocessed area right before processing, and accumulated debris block the laser beam applied. As a result, there arises a problem that the Low-k film in the unprocessed area and the test element group (TEG) formed on the streets cannot be removed surely.

Furthermore, even when a laser beam is applied along the streets formed on the wafer to divide it into individual chips, the laser beam is blocked by the debris accumulated in the above unprocessed area and hence, the energy of the laser beam is not fully absorbed into the processing point of the wafer. Therefore, there is a problem that the wafer cannot be divided into individual chips.

SUMMARY OF THE INVENTION

It is an object of the present invention to provide a wafer processing method capable of preventing the influence of debris produced by the application of a laser beam along streets formed on a wafer.

According to the present invention, the above object can be attained by a wafer processing method for carrying out processing by applying a laser beam along streets formed on a wafer, comprising a step of applying a laser beam at an incident angle of a predetermined inclination angle to the normal line of a processing surface of the wafer while the wafer is processing-fed along a street from one end toward the other end on the side of the laser beam application at an acute angle to the processing surface of the wafer.

Preferably, the above incident angle is set to 15 to 80°.

Preferably, a step of forming a film of a resin, which is dissolved in a solvent, on the processing surface of the wafer is carried out before the laser beam application step, and a step of dissolving the resin film formed on the processing surface of the wafer in a solvent to remove it is carried out after the laser beam application step. Preferably, the resin film is formed of a water-soluble light absorbing resin prepared by mixing a water-soluble resin with a light absorbing agent.

In the laser beam application step of the wafer processing method of the present invention, a laser beam is applied at a predetermined inclination angle to the normal line of the processing surface of the wafer while the wafer is processing-fed along a street from one end to the other end on the side of the laser beam application at an acute angle to the processing surface of the wafer. Therefore, debris produced by the application of a laser beam are scattered over the processed area but not to the unprocessed area. Accordingly, as the debris do not adhere to the unprocessed area of the wafer, laser processing is carried out without the influence of the debris.

BRIEF DESCRIPTION OF THE DRAWINGS

FIGS. 13(a) and 13(b) are explanatory diagrams showing that the cutting step is carried out on the semiconductor wafer after the laser beam application step with the cutting machine shown in FIG. 12;

FIGS. 14(a) and 14(b) are explanatory diagrams showing a state where the semiconductor wafer is cut along the laser groove by the cutting step shown in FIGS. 13(a) and 13(b);

FIGS. 20(a) and 20(b) are explanatory diagrams showing the dividing step which is carried out after the laser beam application step in the laser beam processing method of the present invention;

DETAILED DESCRIPTION OF THE PREFERRED EMBODIMENTS

A wafer processing method according to the present invention of the present invention will be described in detail hereinunder with reference to the accompanying drawings.

Figure 1:
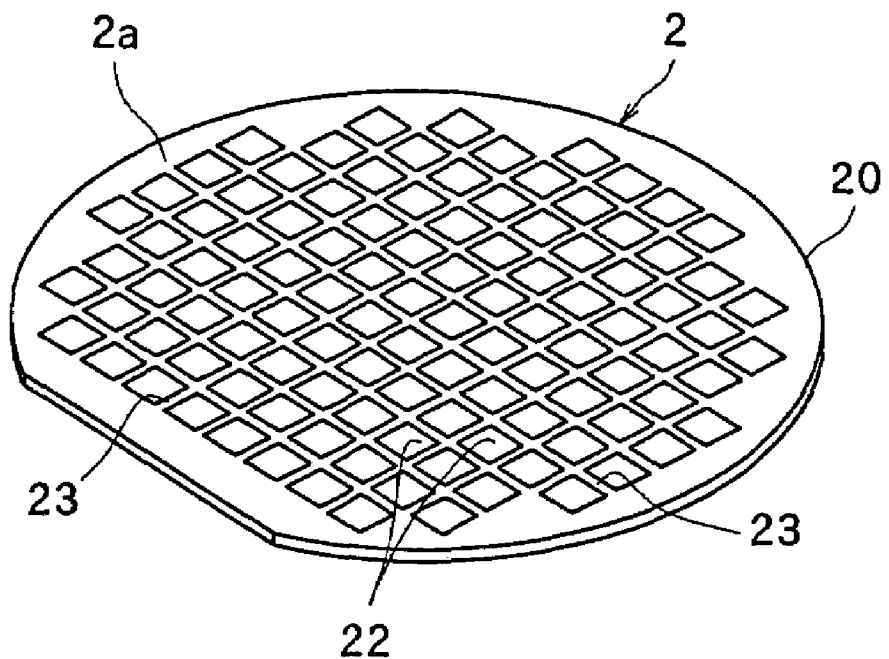
FIG. 1 is a perspective view of a semiconductor wafer to be processed by the wafer processing method of the present invention.
Figure 2:
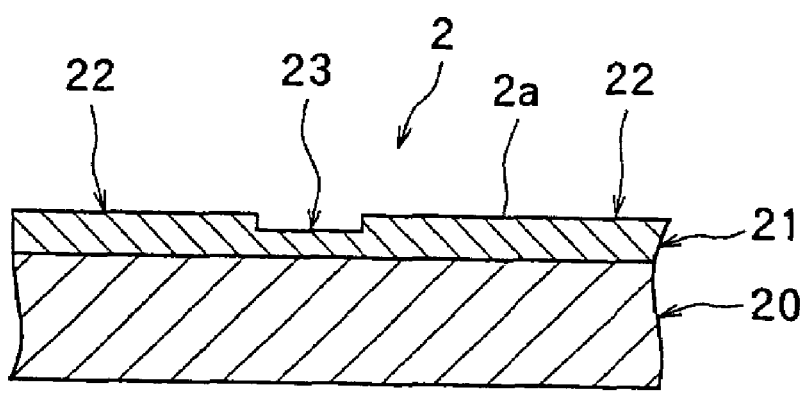
FIG. 2 is an enlarged sectional view of the semiconductor wafer shown in FIG. 1.

FIG. 1 is a perspective view of a semiconductor wafer as a workpiece to be processed by the wafer processing method of the present invention, and FIG. 2 is an enlarged sectional view of the principal section of the semiconductor wafer shown in FIG. 1. In the semiconductor wafer 2 shown in FIG. 1 and FIG. 2, a plurality of semiconductor chips 22 such as IC's or LSI's composed of a laminate 21 consisting of an insulating film and a functional film forming circuits are formed in a matrix on the front surface 20a of a semiconductor substrate 20 such as a silicon substrate. The semiconductor chips 22 are sectioned by streets 23 formed in a lattice pattern. In the illustrated embodiment, the insulating film forming the laminate 21 is an $SiO_2$ film or a low-dielectric insulating film (Low-k film) formed of a film of an inorganic material such as SiOF or BSG (SiOB) or a film of an organic material such as a polyimide-based, parylene-based polymer or the like.

Figure 3:
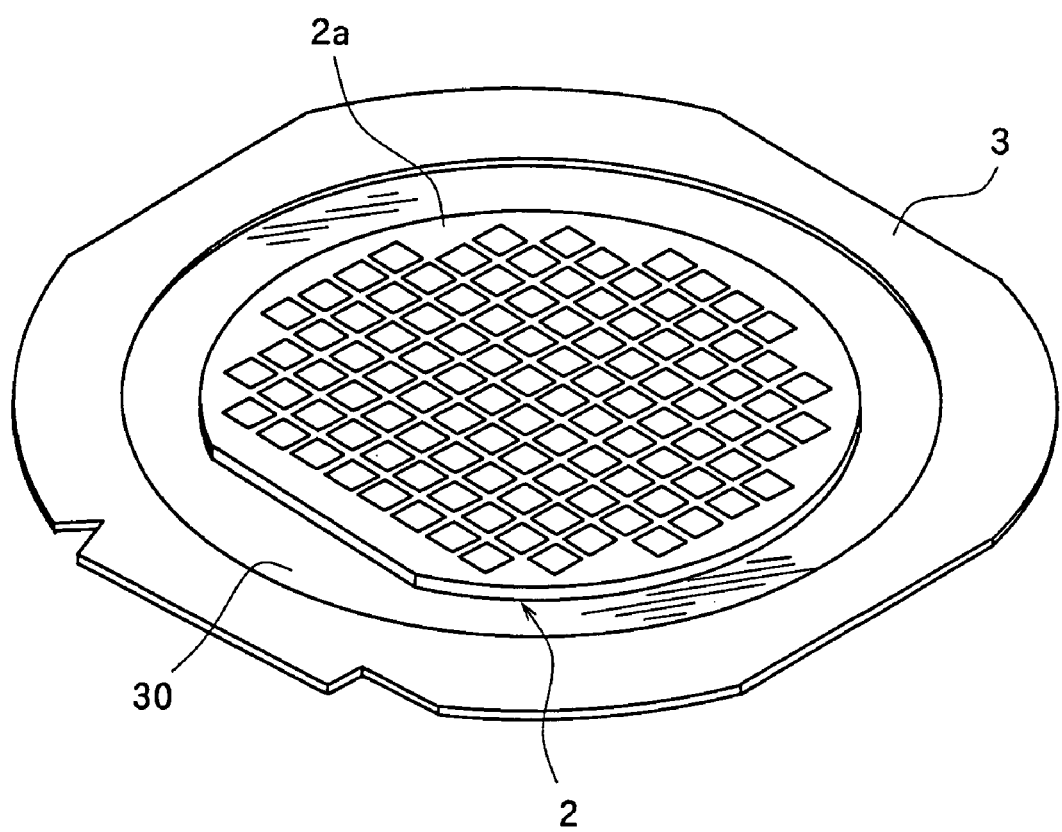
FIG. 3 is a perspective view showing a state where the semiconductor wafer shown in FIG. 1 is supported to an annular frame via a protective tape.

To divide the above-described semiconductor wafer 2 along the streets 23, the semiconductor wafer 2 is put on a protective tape 30 mounted on an annular frame 3 as shown in FIG. 3. At this point, the back surface of the semiconductor wafer 2 is put onto the protective tape 30 in such manner that the front surface 2a faces up.

Next comes the laser beam application step for applying a laser beam along the streets 23 of the semiconductor wafer 2 to remove the laminate 21 on the streets. This laser beam application step is carried out by using a laser beam machine 4 shown in FIGS. 4 to 7. The laser beam machine 4 shown in FIGS. 4 to 7 comprises a chuck table 41 for holding a workpiece and a laser beam application means 42 for applying a laser beam to the workpiece held on the chuck table 41. The chuck table 41 is so constituted as to suction-hold the workpiece and moved by a moving mechanism (not shown) in a processing-feed direction indicated by an arrow X and an indexing-feed direction indicated by an arrow Y in FIG. 4.

Figure 5:
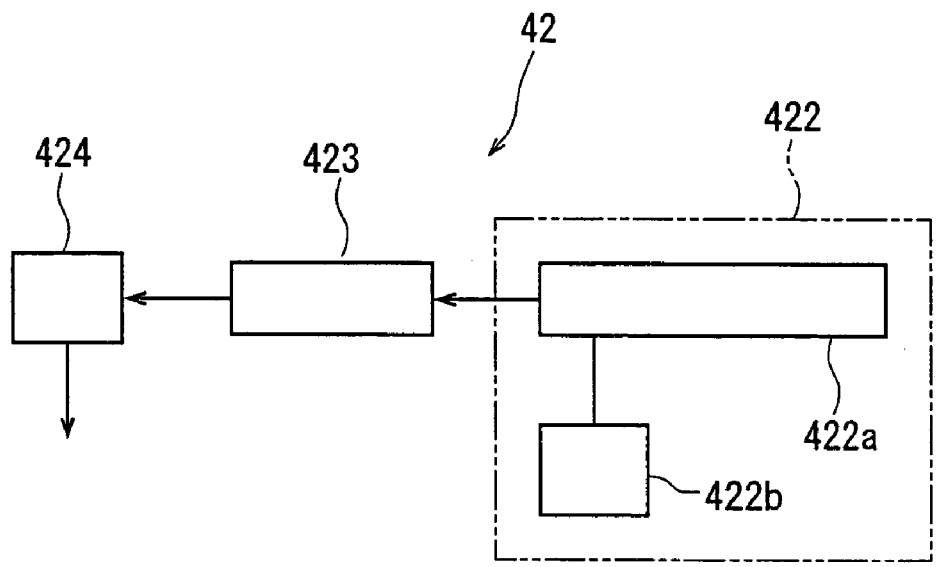
FIG. 5 is a block diagram schematically showing the constitution of laser beam application means provided in the laser beam machine shown in FIG. 4.
Figure 6:
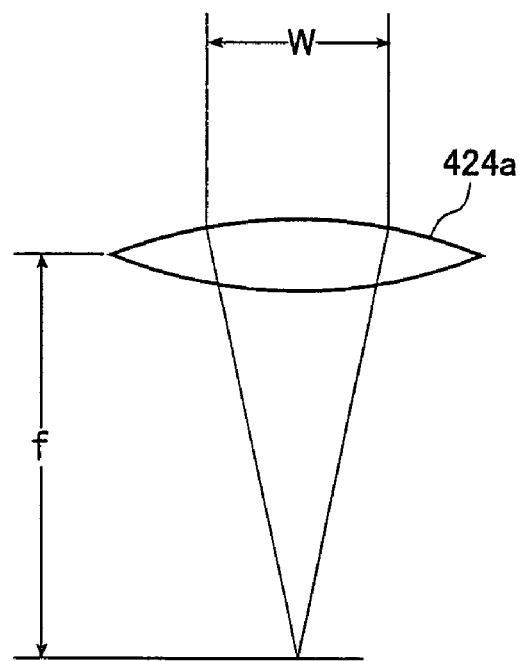
FIG. 6 is a schematic diagram for explaining the focusing spot diameter of a laser beam.

The above laser beam application means 42 comprises a cylindrical casing 421 arranged substantially horizontally. In the casing 421, there are installed a pulse laser beam oscillation means 422 and a transmission optical system 423 as shown in FIG. 5. The pulse laser beam oscillation means 422 is constituted by a pulse laser beam oscillator 422a composed of a YAG laser oscillator or YVO4 laser oscillator and a repetition frequency setting means 422b connected to the pulse laser beam oscillator 422a. The transmission optical system 423 comprises suitable optical elements such as a beam splitter, etc. A condenser 424 housing condensing lenses (not shown) constituted by a set of lenses that may be a known formation is turnably attached to the end of the above casing 421 via a turning cylinder 425. A laser beam oscillated from the above pulse laser beam oscillation means 422 reaches the condenser 424 through the transmission optical system 423 and is applied from the condenser 424 to the workpiece held on the above chuck table 41 at a predetermined focusing spot diameter D. This focusing spot diameter D is defined by the expression D $(\mu m)=4\times\lambda\times f/(\pi\times W)$ (wherein $\lambda$ is the wavelength ($\mu m$) of the pulse laser beam, W is the diameter (mm) of the pulse laser beam applied to an objective lens 424a, and f is the focusing distance (mm) of the objective condenser lens 424a) when the pulse laser beam having a Gaussian distribution is applied through the objective condenser lens 424a of the condenser 424 as shown in FIG. 6.

Figure 7:
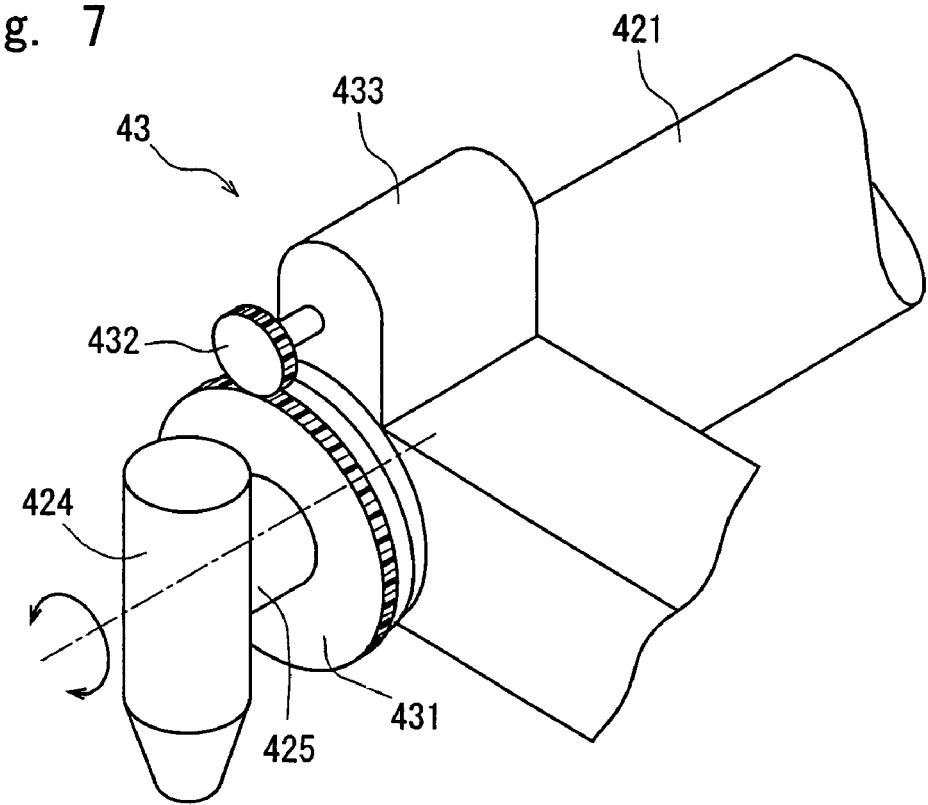
FIG. 7 is a perspective view of an angle control means for controlling a laser beam application angle of a condenser constituting the laser beam application means provided in the laser beam machine shown in FIG. 4.

The illustrated laser beam machine 4 comprises an angle control means 43 for controlling the laser beam application angle of the above condenser 424, as shown in FIG. 7. The angle control means 43 comprises a driven gear 431 fitted onto the turning cylinder 425 to which the condenser 424 is attached, a drive gear 432 to be meshed with the driven gear 431, and a pulse motor 433, which is coupled to the drive gear 432 and works for driving the drive gear 432. The thus constituted angle control means 43 turns the condenser 424 in a direction indicated by an arrow in FIG. 7 on the rotary cylinder 425 as the center by driving the pulse motor 433 in a normal direction or reverse direction.

Figure 4:
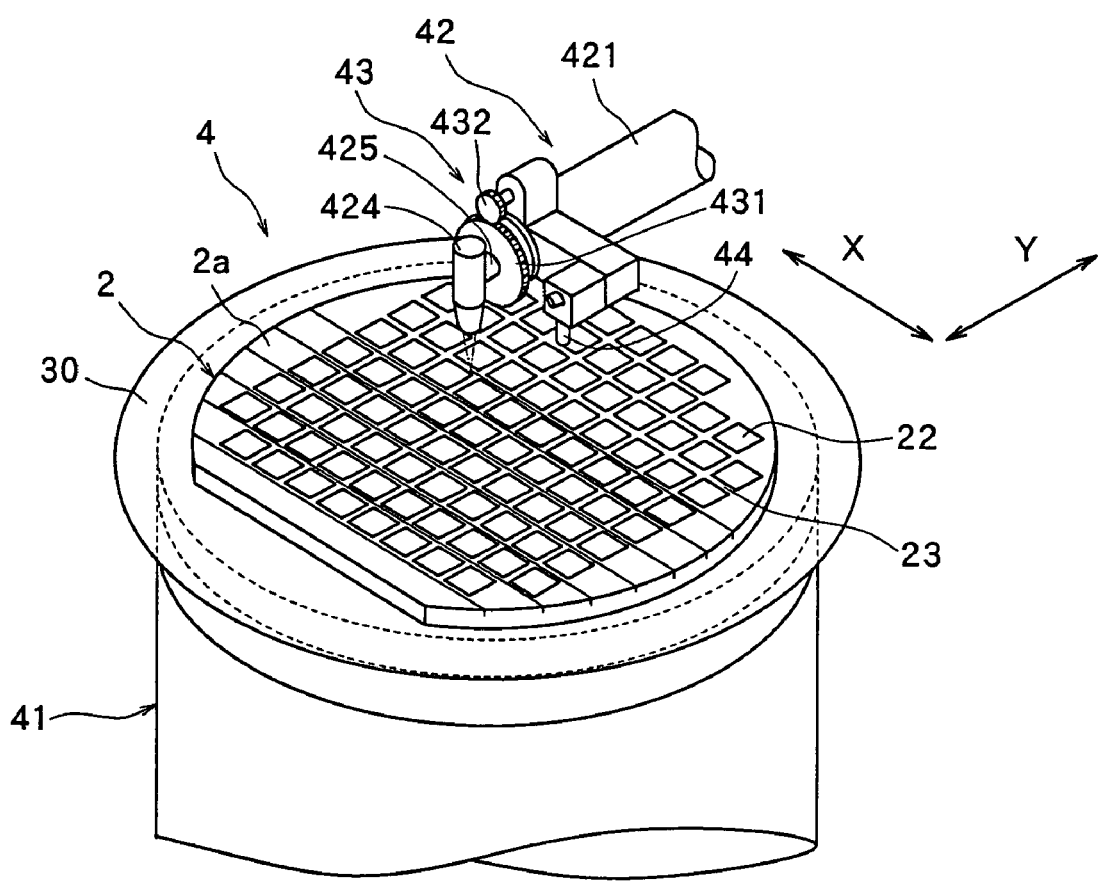
FIG. 4 is a perspective view of the principal section of a laser beam machine for carrying out the laser beam application step in the wafer processing method of the present invention.

The illustrated laser beam machine 4 comprises an image pick-up means 44 attached to the end of the casing 421 constituting the above laser beam application means 42, as shown in FIG. 4. This image pick-up means picks up an image of the workpiece held on the chuck table 41. The image pick-up means 44 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

The laser beam application step which is carried out by using the above laser beam machine 4 will be described with reference to FIG. 4 and FIGS. 8 to 11.

In the laser beam application step, the semiconductor wafer 2 is first placed on the chuck table 41 of the above laser beam machine 4 shown in FIG. 4 and is suction-held on the chuck table 41. At this point, the semiconductor wafer 2 is held in such a manner that the front surface 2a faces up. In FIG. 4, the annular frame 3 having the protective tape 30 affixed thereto is omitted. The annular frame 3 is held by a suitable frame holding means of the chuck table 41.

The chuck table 41 suction-holding the semiconductor wafer 2 as described above is brought to a position right below the image pick-up means 44 by a moving mechanism that is not shown. After the chuck table 41 is positioned right below the image pick-up means 44, alignment work for detecting the area to be processed of the semiconductor wafer 2 is carried out by the image pick-up means 44 and the control means that is not shown. That is, the image pick-up means 44 and the control means (not shown) carry out image processing such as pattern matching to align a street 23 formed in a predetermined direction of the semiconductor wafer 2 with the condenser 424 of the laser beam application means 42 for applying a laser beam along the street 23, thereby performing the alignment of a laser beam application position. The alignment of the laser beam application position is also similarly carried out on streets 23 that are formed on the semiconductor wafer 2 and extend in a direction perpendicular to the above predetermined direction.

Figure 8:
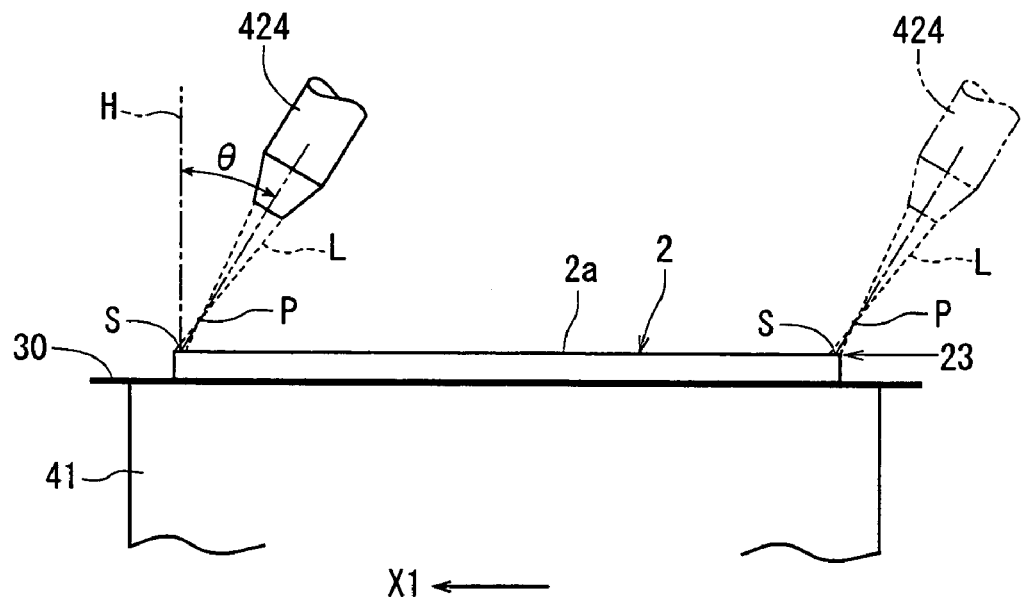
FIG. 8 is an explanatory diagram showing an embodiment of the laser beam application step in the wafer processing method of the present invention.

After the street 23 formed on the semiconductor wafer 2 held on the chuck table 41 is detected and the alignment of the laser beam application position is carried out as described above, the chuck table 41 is moved to a laser beam application area where the condenser 424 of the laser beam application means 42 for applying a laser beam is located as shown in FIG. 8, to bring the predetermined street 23 to a position right below the condenser 424. At this point, the condenser 424 is positioned at an incident angle $\theta$ of a predetermined inclination angle to the normal line H of the front surface 2a that is the processing surface of the semiconductor wafer 2 on the right of the normal line H in FIG. 8, by activating the above angle control means 43. The above incident angle $\theta$ may be set to 15 to 80°. The surface at one end (left end in FIG. 8) of the predetermined street 23 is aligned with the processing spot S of a laser beam L applied from the condenser 424. The diameter of this processing spot S is set larger than the focusing spot diameter (for example, 9.2 $\mu m$) of the laser beam L applied from the condenser 424, for example, 30 to 40 $\mu m$. Therefore, in the illustrated embodiment, the condenser 424 is positioned such that the focusing point P of the laser beam L is located on the condenser 424 side of the front surface 2a that is the processing surface of the semiconductor wafer 2.

The chuck table 41, that is, the semiconductor wafer 2 is then processing-fed in the direction indicated by the arrow X1 in FIG. 8 at a predetermined feed rate while the pulse laser beam L is applied from the condenser 424. With this processing feed, the laser beam L is moved along the street 23 from one end (right end in FIG. 8) to the other end (left end in FIG. 8) on the side of the laser beam L application at an acute angle to the front surface 2a which is the processing surface of the semiconductor wafer 2. When the other end (right end in FIG. 8) of the street 23 reaches the processing spot S of the laser beam applied from the condenser 424, as shown by a two-dot chain line in FIG. 8, the application of the pulse laser beam L is suspended and the movement of the chuck table 41, that is, the semiconductor wafer 2 is stopped.

Figure 9:
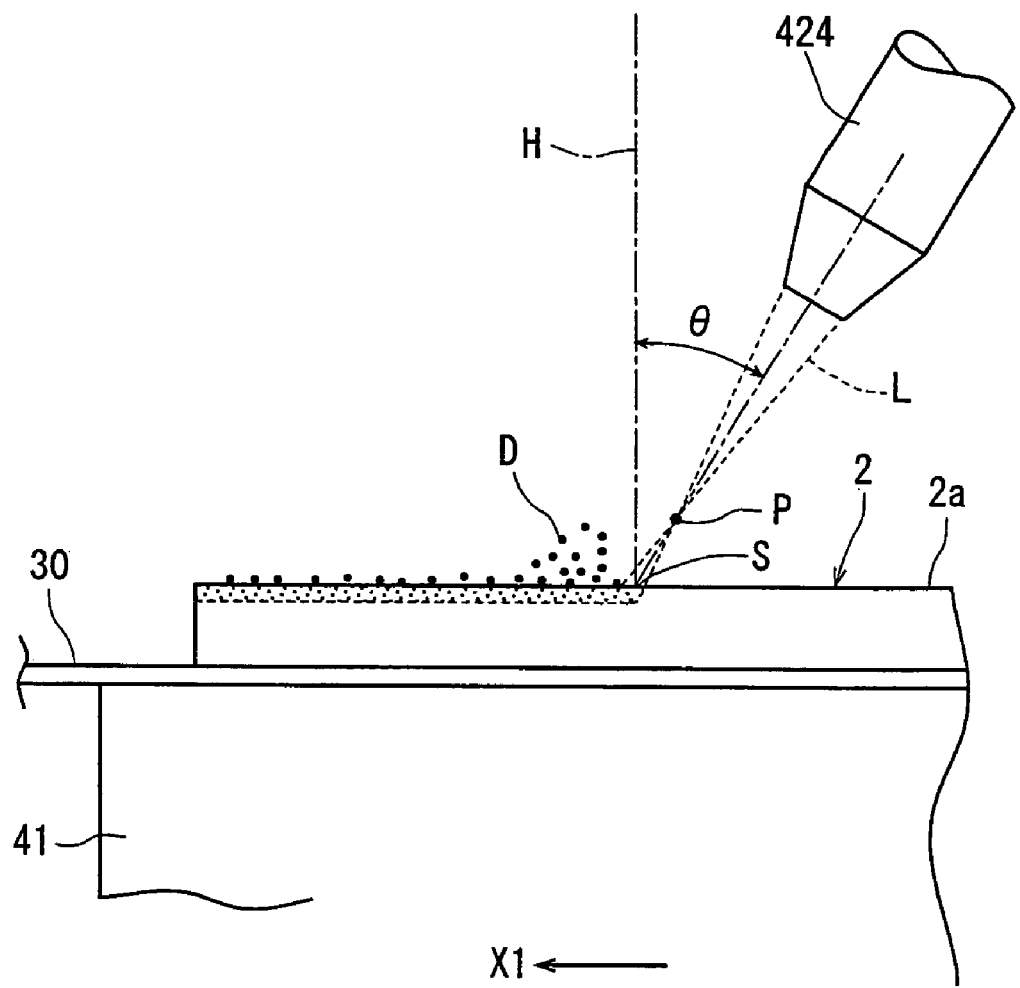
FIG. 9 is an explanatory diagram showing a processing state in the laser beam application step shown in FIG. 8.
Figure 10:
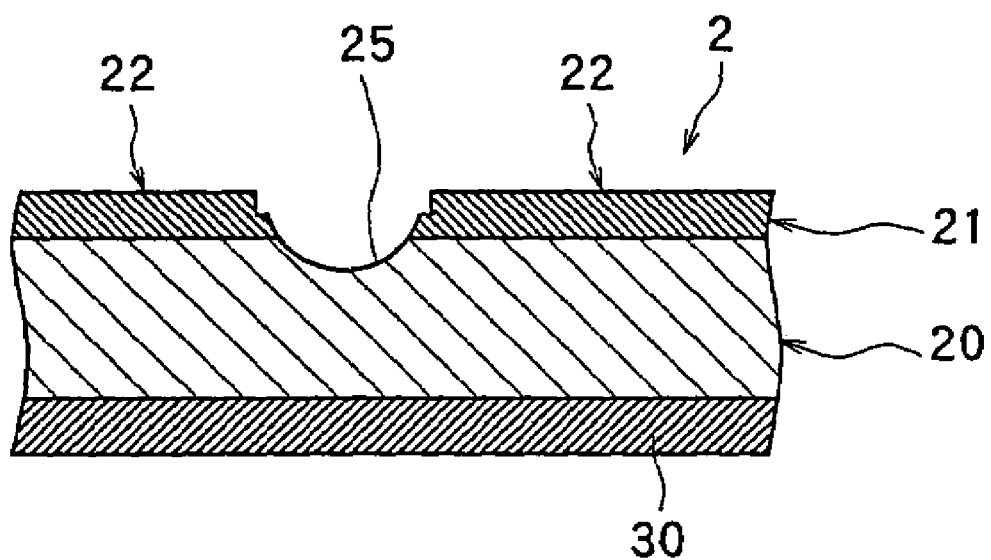
FIG. 10 is an enlarged sectional view of the principal section of a semiconductor wafer, showing a laser groove formed in the semiconductor wafer by the laser beam application step shown in FIG. 8.

Since the chuck table 41, that is, the semiconductor wafer 2 is processing-fed in the direction indicated by the arrow X1 from one end (right end in FIG. 8) to the other end (left end in FIG. 8) of the street 23 on the side of the laser beam L application at an acute angle to the front surface 2a that is the processing surface of the semiconductor wafer 2 in the above laser beam application step, the debris D produced by the application of the laser beam L are scattered to the left side (already processed area) in FIG. 9 of the processing spot S of the laser beam L as shown in FIG. 9. Therefore, as the debris D do not adhere to the unprocessed area on the right side in FIG. 9 of the processing spot S of the laser beam L, laser processing is carried out without the influence of the debris D. As a result, the energy of the laser beam L applied along the street 23 of the semiconductor wafer 2 is fully absorbed into the laminate 21 laminated on the front surface of the semiconductor wafer 2 to form a laser processing groove 25 devoid of the laminate 21 along the street 23 as shown in FIG. 10.

The above laser beam application step is carried out under the following processing conditions, for example.

Figure 11:
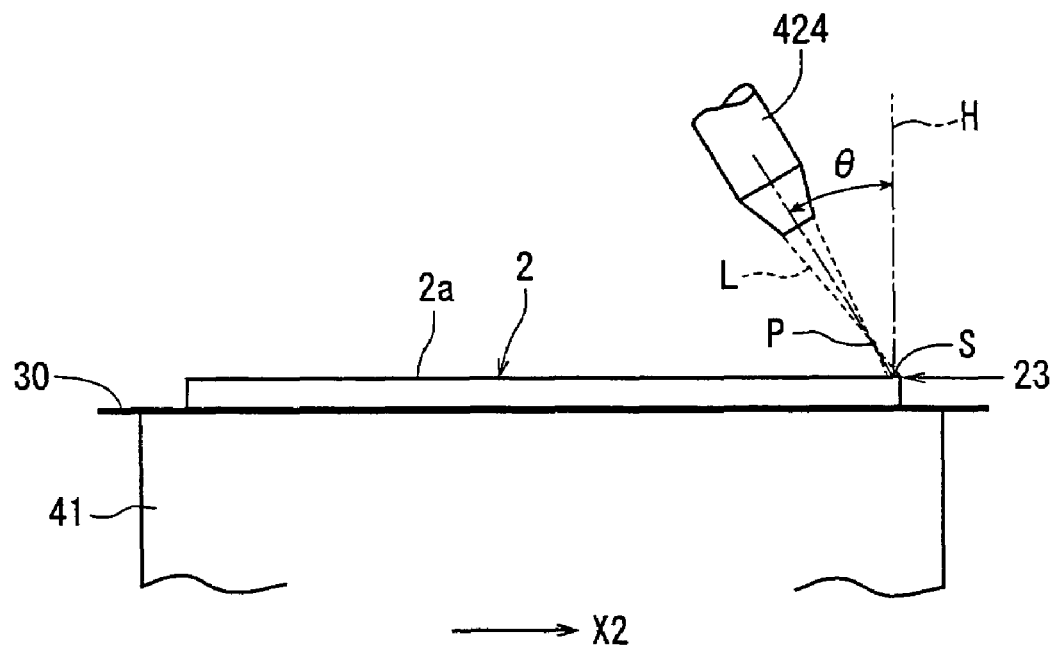
FIG. 11 is an explanatory diagram showing another embodiment of the laser beam application step in the wafer processing method of the present invention.

Light source of laser beam: YVO4 laser or YAG laser
Wavelength: 355 nm
Repetition frequency: 50 to 100 kHz
Output: 0.3 to 5.0 W
Focusing spot diameter: 9.2 µm
Processing spot diameter: 30 to 40 µm
Processing feed rate: 1 to 800 mm/sec After the laser beam application step is carried out along the predetermined street as described above, the chuck table 41, therefore, the semiconductor wafer 2 held on the chuck table 41 is indexing-fed by an amount corresponding to the interval between the streets in the direction indicated by the arrow Y (indexing step). As shown in FIG. 11, the above angle control means 43 (see FIG. 7) is then activated to position the condenser 424 at the incident angle θ of the predetermined inclination angle to the normal line H of the front surface 2a that is the processing surface of the semiconductor wafer 2 on the left side of the normal line H in the drawing. Then, the chuck table 41, that is, the semiconductor wafer 2 is processing-fed in the direction indicated by the arrow X2 in FIG. 11 at a predetermined feed rate while the pulse laser beam L is applied from the condenser 424. By this processing feed, the laser beam L is moved along the street 23 from one end (left end in FIG. 11) to the other end (right end in FIG. 11) on the side of the laser beam L application at an acute angle to the front surface 2a which is the processing surface of the semiconductor wafer 2. The processing conditions may be the same as those of the above-described laser beam application step. As a result, the laminate 21 laminated on the front surface of the semiconductor wafer 2 is removed along the street 23, and a laser groove 25 is formed along the street 23 as shown in FIG. 10.

After the laser beam application step and the indexing step are carried out on all the streets 23 extending in the predetermined direction of the semiconductor wafer 2, the chuck table 41, that is, the semiconductor wafer 2 held on the chuck table 41 is turned at 90° to carry out the above laser beam application step and indexing step along streets extending in a direction perpendicular to the above predetermined direction, thereby making it possible to remove the laminate 21 to form the laser groove 25 along all the streets 23 formed on the semiconductor wafer 2.

Figure 12:
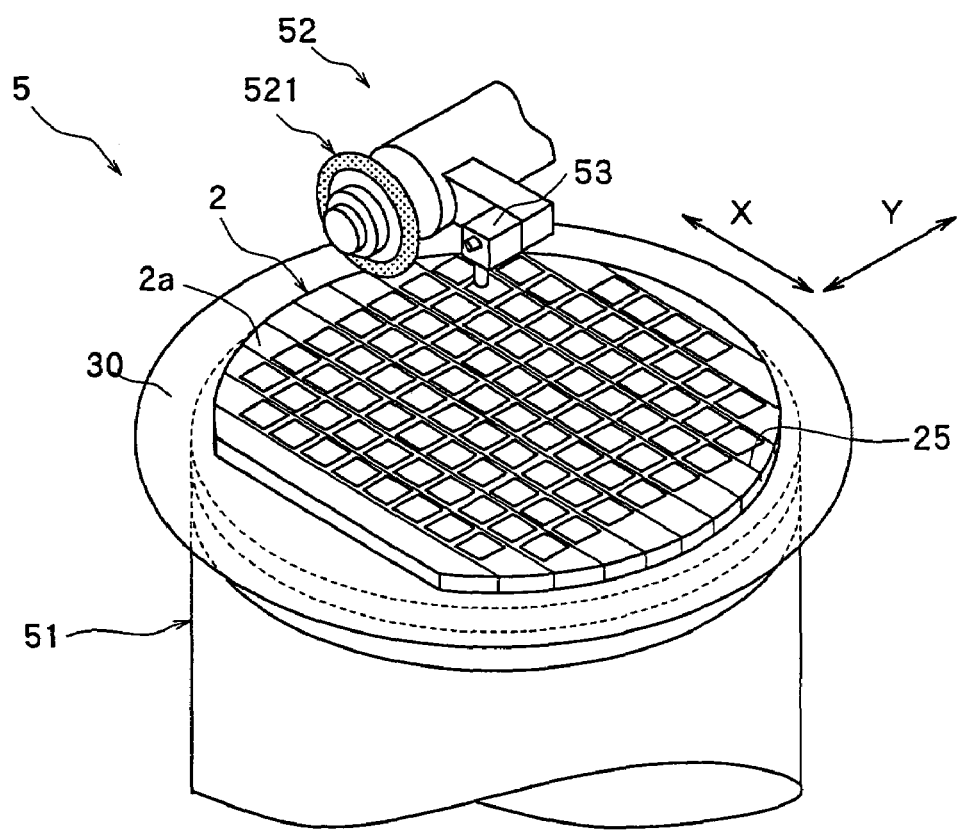
FIG. 12 is a perspective view of the principal section of a cutting machine for carrying out the cutting step after the laser beam application step in the wafer processing method of the present invention.

After the laser beam application step is carried out as described above, the step of cutting the semiconductor wafer 2 along the laser grooves 25 formed in the streets 23 of the semiconductor wafer 2. In this cutting step, a cutting machine 5 which is generally used as a dicing machine as shown in FIG. 12 may be used. That is, the cutting machine 5 comprises a chuck table 51 having a suction-holding means, a cutting means 52 having a cutting blade 521, and an image pick-up means 53 for picking up an image of the workpiece held on the chuck table 51.

The cutting step to be carried out with the above cutting machine 5 will be described with reference to FIGS. 12 to 14(a) and 14(b).

That is, as shown in FIG. 12, the semiconductor wafer 2 which has been subjected to the above laser beam application step is placed on the chuck table 51 of the cutting machine 5 in such a manner that the front surface 2a of the semiconductor wafer 2 faces up and held on the chuck table 51 by a suction means that is not shown. The chuck table 51 suction-holding the semiconductor wafer 2 is positioned right below the image pick-up means 53 by a moving mechanism that is not shown.

After the chuck table 51 is positioned right below the image pick-up means 53, alignment work for detecting the area to be cut of the semiconductor wafer 2 is carried out by the image pick-up means 53 and a control means that is not shown. That is, the image pick-up means 53 and the control means (not shown) carry out image processing such as pattern matching, etc. to align a street 23 formed in a predetermined direction of the semiconductor wafer 2 with the cutting blade 521 for cutting along the laser groove 25, thereby performing the alignment of the area to be cut. The alignment of the area to be cut is also similarly carried out on streets 23 that are formed on the semiconductor wafer 2 and extend in a direction perpendicular to the above predetermined direction.

After the street 23 formed on the semiconductor wafer 2 held on the chuck table 51 is detected and the alignment of the area to be cut is carried out as described above, the chuck table 51 holding the semiconductor wafer 2 is moved to the cutting start position of the area to be cut. At this point, as shown in FIG. 13(a), the semiconductor wafer 2 is brought to a position where one end (left end in FIGS. 13(a) and 13(b)) of the street 23 to be cut is located on the right side by a predetermined distance from right below the cutting blade 521. The semiconductor wafer 2 is also positioned such that the cutting blade 521 can be located in the center of the laser groove 25 formed in the street 23.

After the chuck table 51, that is, the semiconductor wafer 2 is thus brought to the cutting start position of the area to be cut, the cutting blade 521 is moved down from its standby position shown by a two-dot chain line in FIG. 13(a) to a predetermined cutting position shown by a solid line in FIG. 13(a). This cutting position is set to a position where the lower end of the cutting blade 521 reaches the protective tape 30 affixed to the back surface of the semiconductor wafer 2 as shown in FIG. 13(a) and FIG. 14(a). Thereafter, the cutting blade 521 is turned at a predetermined revolution and the chuck table 51, that is, the semiconductor wafer 2 is moved in the direction indicated by the arrow X1 in FIG. 13(a) at a predetermined feed rate. When the chuck table 51, that is, the semiconductor wafer 2 is moved to a position where the other end (right end in FIGS. 13(a) and 13b)) of the street 23 is located on the left side by a predetermined distance from right below the cutting blade 521 as shown in FIG. 13(b), the movement of the chuck table 51, that is, the semiconductor wafer 2 is stopped. By thus moving the chuck table 51, that is, the semiconductor wafer 2, a cut groove 27 which reaches the back surface is formed along the laser groove 25 formed in the street 23 of the semiconductor wafer 2 to cut the semiconductor wafer 2, as shown in FIG. 14(b). In this cutting step, only the semiconductor substrate 20 is cut with the cutting blade 521. Therefore, the peeling of the laminate 21 caused by cutting the laminate 21 formed on the front surface of the semiconductor substrate 20 with the cutting blade 521 can be prevented in advance.

The above cutting step is carried out under the following processing conditions, for example.

Cutting blade: outer diameter of 52 mm, thickness of 20 µm
Revolution of cutting blade: 30,000 rpm
Cutting-feed rate: 50 mm/sec Thereafter, the cutting blade 521 is positioned to the standby position shown by the two-dot chain line in FIG. 13(*b*), and the chuck table 51, that is, the semiconductor wafer 2 is moved in the direction indicated by the arrow X2 in FIG. 13(*b*) to return to the position shown in FIG. 13(*a*). The chuck table 51, that is, the semiconductor wafer 2 is then moved by an amount corresponding to the interval between the streets 23 in a direction (indexing-feed direction) perpendicular to the sheet to bring a street 23 to be cut next to a position corresponding to the cutting blade 521. After the street 23 to be cut next is brought to the position corresponding to the cutting blade 521 as described above, the above-mentioned cutting step is carried out.

The above cutting step is carried out on all the streets 23 formed on the semiconductor wafer 2. As a result, the semiconductor wafer 2 is cut along the laser grooves 25 formed in the streets 23 to be divided into individual semiconductor chips 22.

A description will be subsequently given of the processing method for dividing an optical device wafer into individual optical devices with reference to FIGS. 15 to 19.

Figure 15:
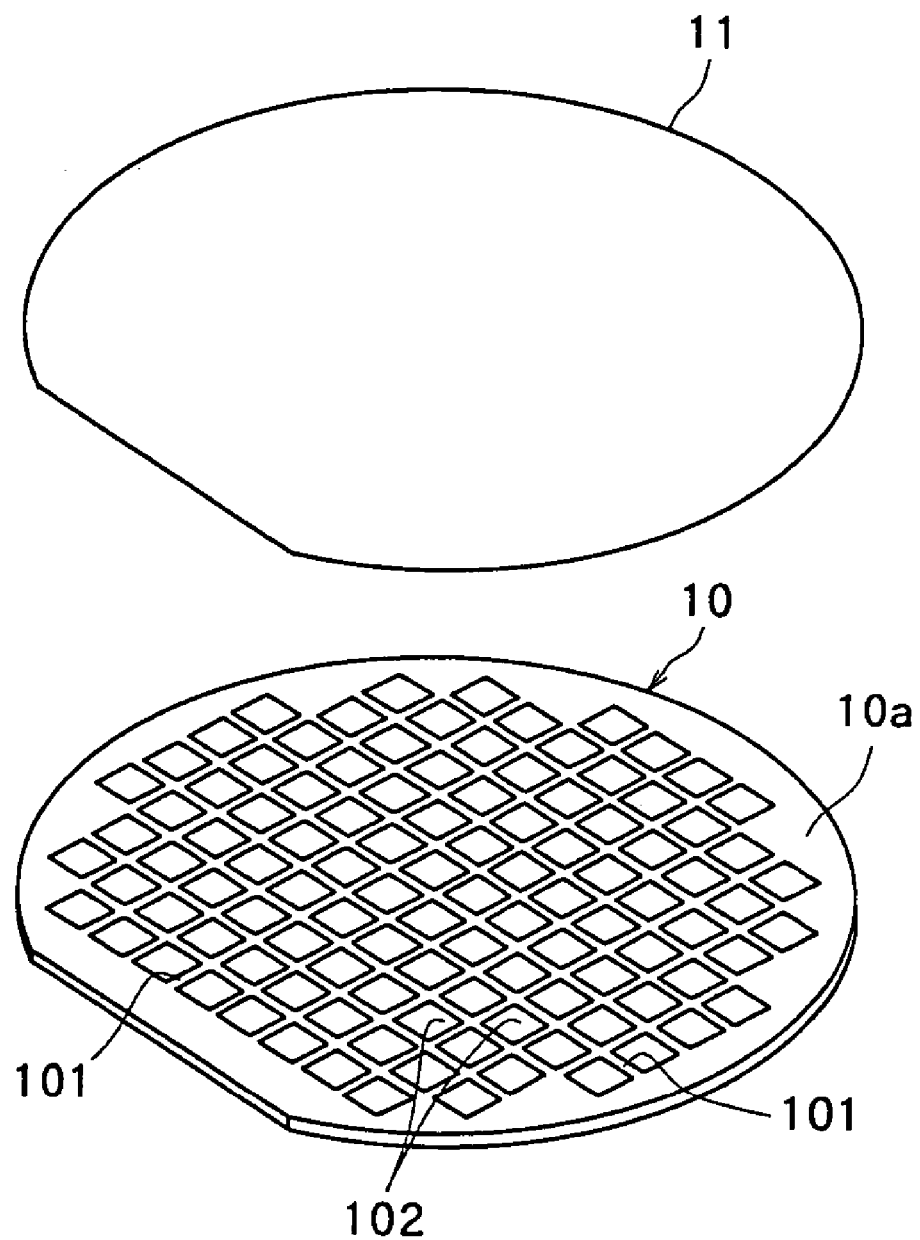
FIG. 15 is a perspective view of an optical device wafer to be processed by the wafer processing method of the present invention.

FIG. 15 is a perspective view of an optical device wafer 10. In the optical device wafer 10 shown in FIG. 15, a plurality of streets 101 are formed in a lattice pattern on the front surface 10*a* of a sapphire substrate, and an optical device 102 comprising a gallium nitride-based compound semiconductor or the like is formed in a plurality of areas sectioned by the plurality of streets 101. To divide the thus constituted optical device wafer 10 into individual optical devices 102, a protective tape 11 is affixed to the front surface 10*a*.

Figure 16:
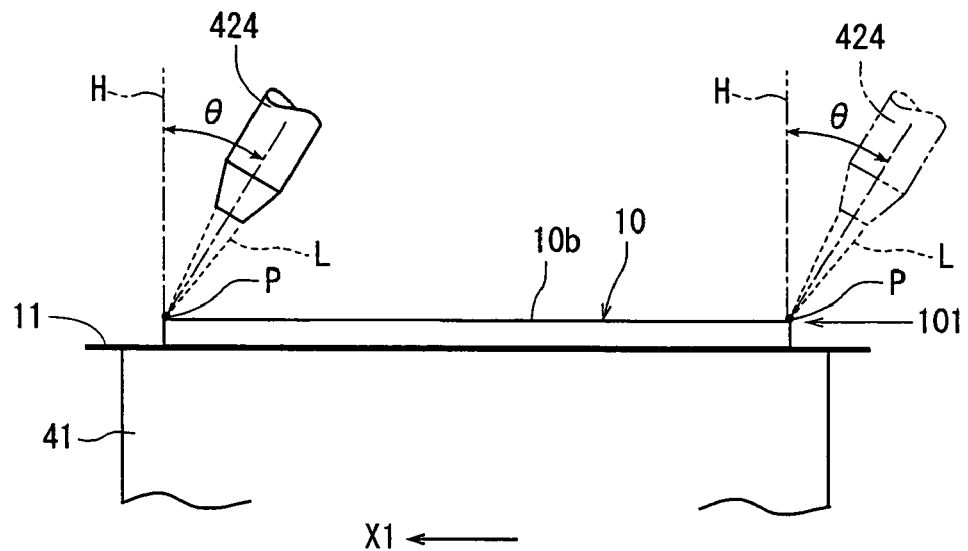
FIG. 16 is an explanatory diagram showing still another embodiment of the laser beam application step in the wafer processing method of the present invention.

After the protective tape 11 is affixed to the front surface 10*a* of the optical device wafer 10 as described above, the step of applying a laser beam along the streets 101 of the optical device wafer 10 is carried out. This laser beam application step is carried out by using the above laser beam processing machine 4 shown in FIGS. 4 to 7. That is, as shown in FIG. 16, the optical device wafer 10 is placed on the chuck table 41 of the laser beam machine 4 in such a manner that the surface side to which the protective tape 11 is affixed faces down, and suction-held on the chuck table 41. Therefore, the back surface 10*b* of the optical device wafer 10 faces up. A street 101 formed on the optical device wafer 10 is aligned with the condenser 424 of the laser beam application means 42 to perform the alignment of a laser beam application position. Although the front surface 10*a* having the streets 101 of the optical device wafer 10 faces down at this point, this alignment can be carried out from the back surface 10*b* by the image pick-up means for picking up an image of the street 101 with infrared radiation.

The predetermined street 101 formed on the optical device wafer 10 is then moved to a laser beam application area where the condenser 424 of the laser beam application means 42 is located to be positioned right below the condenser 424. At this point, the condenser 424 is positioned at the incident angle θ of the predetermined inclination angle to the normal line H of the back surface 10*b* that is the processing surface of the optical device wafer 10 on the right side of the normal line H in FIG. 16, by activating the above angle control means 43. The incident angle θ is desirably set to the Brewster's angle of the sapphire substrate forming the optical device wafer 10. The focusing point P of the laser beam L applied from the condenser 424 is set to one end (left end in FIG. 16) of the predetermined street 101.

Thereafter, the chuck table 41, that is, the optical device wafer 10 is moved in the direction indicated by the arrow X1 in FIG. 16 at a predetermined feed rate while a pulse laser beam L is applied from the condenser 424. With this processing feed, the laser beam L is moved along the street 101 from one end (right end in FIG. 16) to the other end (left end in FIG. 16) on the side of the laser beam L application at an acute angle to the back surface 10*b* that is the processing surface of the optical device wafer 10, similarly to the above embodiment shown in FIG. 8. When the other end (right end in FIG. 16) of the street 101 reaches the focusing point P of the laser beam L applied from the condenser 424 as shown by a two-dot chain line in FIG. 16, the application of the pulse laser beam L is suspended and the movement of the chuck table 41, that is, the optical device wafer 10 is stopped.

Figure 17:
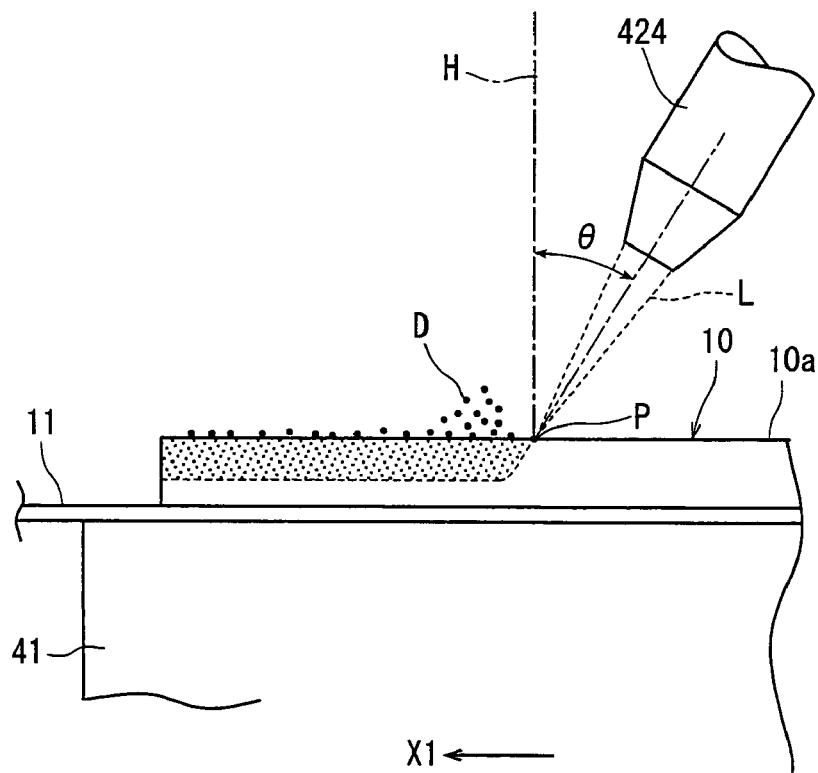
FIG. 17 is an explanatory diagram showing a processing state in the laser beam application step shown in FIG. 16.
Figure 18:
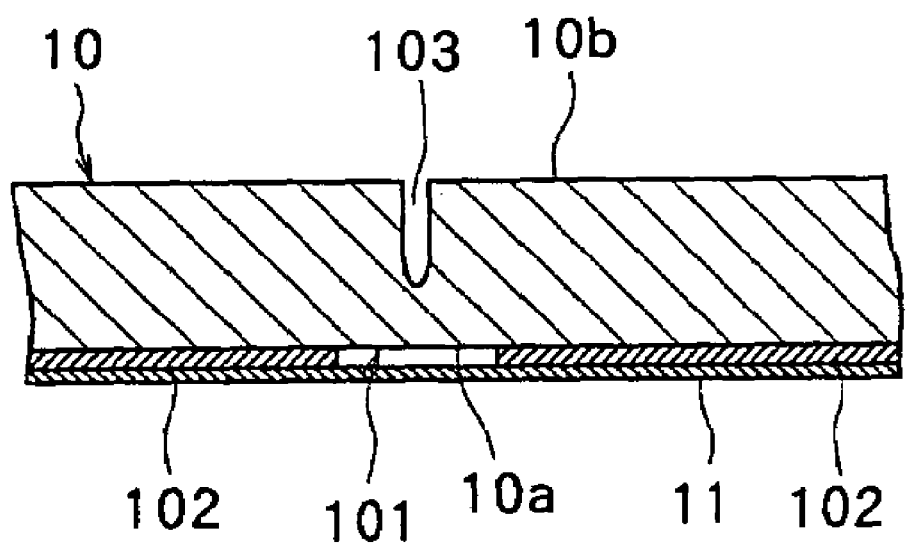
FIG. 18 is an enlarged sectional view of the principal section of the optical device wafer, showing a laser groove formed in the optical device wafer by the laser beam application step in the wafer processing method of the present invention.

Since the chuck table 41, that is, the optical device wafer 10 is processing-fed in the direction indicated by the arrow X1 from one end (right end in FIG. 16) toward the other end (left end in FIG. 16) of the street 101 on the side of the laser beam L application at an acute angle to the back surface 10*b* that is the processing surface of the optical device wafer 10, debris D produced by applying the laser beam L are scattered to the left side (already processed area) in FIG. 17 of the focusing point P of the laser beam L as show in FIG. 17. Therefore, as the debris D do not adhere to the unprocessed area on the right side in FIG. 17 of the focusing point P of the laser beam L, laser processing is carried out without the influence of the debris D. As a result, the energy of the laser beam L applied along the street 101 of the optical device wafer 10 is fully absorbed into the sapphire substrate forming the optical device wafer 10 to form a laser groove 103 along the street 101 in the optical device wafer 10 as shown in FIG. 18. The processing conditions in this laser beam application step may be the same as those of the above laser beam application step shown in FIG. 8.

Figure 19:
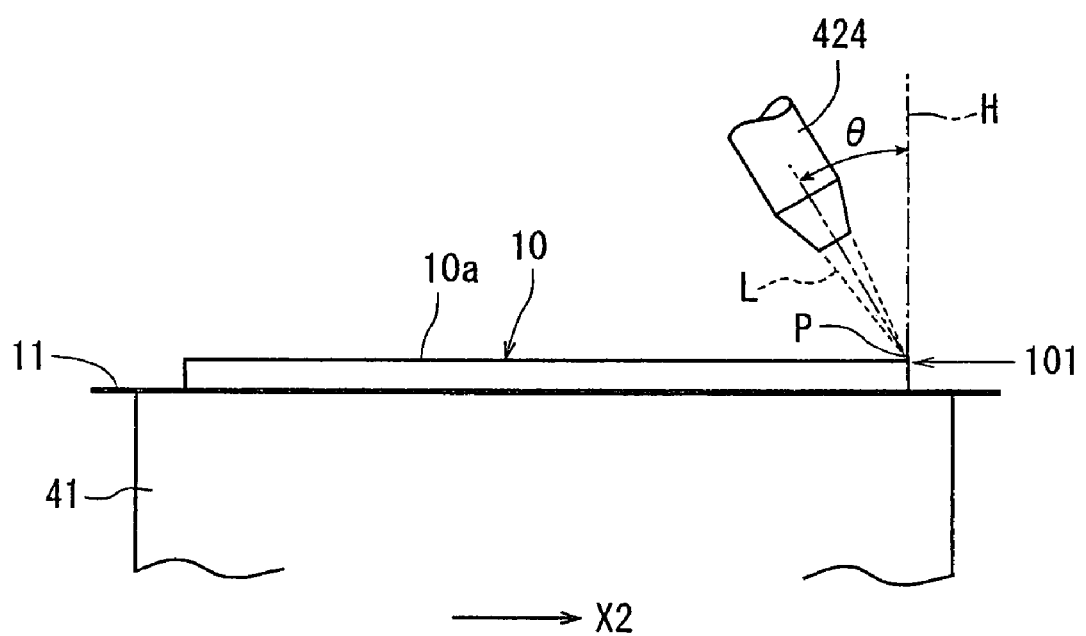
FIG. 19 is an explanatory diagram showing a further embodiment of the laser beam application step in the wafer processing method of the present invention.

After the laser beam application step is carried out along the predetermined street as described above, the chuck table 41, that is, the optical device wafer 10 held on the chuck table 41 is indexing-fed by an amount corresponding to the interval between the streets in the direction indicated by the arrow Y (see FIG. 4) (indexing step). As shown in FIG. 19, the above angle control means 43 (see FIG. 7) is activated to position the condenser 424 at the incident angle θ of the predetermined inclination angle to the normal line H of the back surface 10*b* that is the processing surface of the optical device wafer 10 on the left side of the normal line H in FIG. 19. The chuck table 41, that is, the optical device wafer 10 is then processing-fed in the direction indicated by the arrow X2 in FIG. 19 at a predetermined feed rate while the pulse laser beam L is applied from the condenser 424. The processing conditions may be the same as those of the above laser beam application step. As a result, a laser groove 103 is formed along the street 101 in the optical device wafer 10.

After the laser beam application step and the indexing step are carried out on all the streets extending in the predetermined direction of the optical device wafer 10, the chuck table 41, that is, the optical device wafer 10 held on the chuck table 41 is turned at 90° to carry out the above-mentioned laser beam application step and indexing step along streets extending in a direction perpendicular to the above predetermined direction, thereby making it possible to form laser grooves 103 along all the streets 101 formed on the optical device wafer 10 as shown in FIG. 18. In the above laser beam application step, by setting the incident angle θ of the laser beam L to the Brewster's angle of the sapphire substrate forming the optical device wafer 10, the absorption of the laser beam can be improved, thereby making it possible to form deep laser grooves 103.

After the above laser beam application step is carried out on all the streets 101 formed on the optical device wafer 10, next comes the step of dividing the optical device wafer 10 along the laser grooves 103 formed in the streets 101. In this dividing step, the optical device wafer 10 is placed on a plurality of columnar support members 12 arranged parallel to one another in such a manner that the laser groove 103 formed back surface 10b faces down as shown in FIG. 20(a), for example. At this point, the laser grooves 103 are positioned between adjacent support members 12 and 12. Pressing members 13 are pressed against the laser grooves 103, that is, the streets 101 from the side of the protective sheet 11 affixed to the front surface 10a of the optical device wafer 10. As a result, flexural load is applied to the optical device wafer 10 along the laser grooves 103, that is, the streets 101 to generate tensile stress on the back surface 10b, thereby forming dividing portions 104 in the optical device wafer 10 along the laser grooves 103, that is, the streets 101 formed in a predetermined direction, as shown in FIG. 20(b). Thus, the optical device wafer 10 is divided. After the optical device wafer 10 is divided along the laser grooves 103, that is, the streets 101 formed in the predetermined direction, the optical device wafer 10 is turned at 90° to carry out the above dividing work along the laser grooves 103, that is, the streets 101 formed in a direction perpendicular to the above predetermined direction, thereby making it possible to divide the optical device wafer 10 into individual optical devices 102. Since the protective sheet 11 is affixed to the front surface 10a, the individual optical devices 102 do not fall apart and the state of the optical device wafer 10 is maintained.

Figure 21:
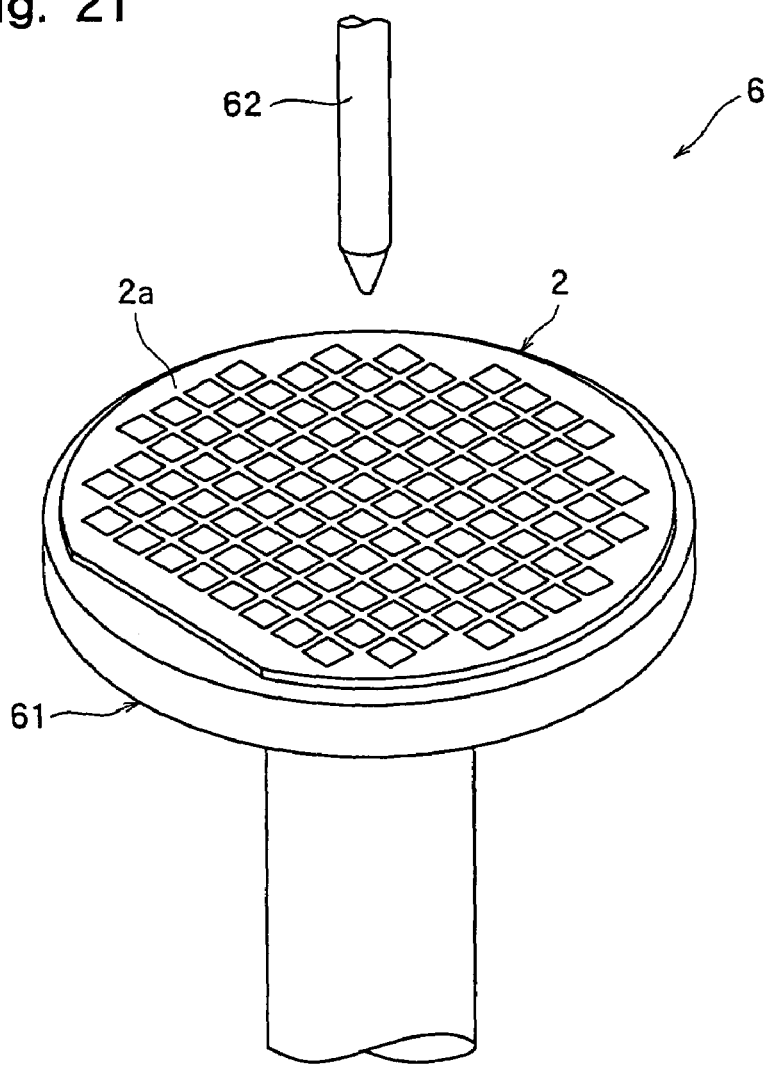
FIG. 21 is an explanatory diagram showing an embodiment of the resin film forming step in the wafer processing method of the present invention.
Figure 22:
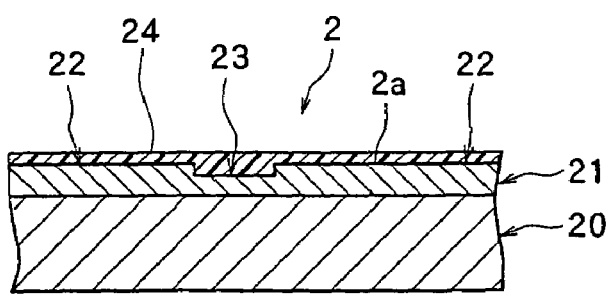
FIG. 22 is an enlarged sectional view of the principal section of a semiconductor wafer coated with a resin film by the resin film forming step shown in FIG. 21.

A description will be subsequently given of another embodiment of the wafer processing method of the present invention with reference to FIGS. 21 to 26. In this embodiment, the step of forming a resin film, which absorbs a laser beam, on the front surface 2a that is the processing surface of the semiconductor wafer 2 is carried out before the laser beam application step shown in FIGS. 1 to 14. This resin film forming step is to apply a resin that absorbs a laser beam to the front surface 2a of the semiconductor wafer 2 with a spin coater 6 as shown in FIG. 21. That is, the spin coater 6 comprises a chuck table 61 having a suction-holding means and a nozzle 62 arranged above the center portion of the chuck table 61. The semiconductor wafer 2 is placed on the chuck table 61 in such a manner that the front surface 2a faces up, and a liquid resin is dropped on the center portion of the front surface of the semiconductor wafer 2 from the nozzle 62 while the chuck table 61 is turned. Thereby, the liquid resin flows up to the periphery of the semiconductor wafer 2 by centrifugal force to cover the front surface 2a of the semiconductor wafer 2. This liquid resin cures by itself along the passage of time to form a resin film 24 having a thickness of about 1 to 5 μm on the front surface 2a of the semiconductor wafer 2 as shown in FIG. 22. The resin for covering the front surface 2a of the semiconductor wafer 2 is desirably a water-soluble resist.

The resin for forming the above resin film 24 will be described hereinunder. It is important that this resin should have a property of absorbing a laser beam as described above, and its light absorption coefficient is preferably 1,000/cm or more. The resin for forming the above resin film 24 is desirably water-soluble. A mixture of a polyvinyl alcohol and titanium dioxide as a light absorbing agent may be used as the resin. The light absorbing agent may be suitably selected from cerium oxide, carbon black, zinc oxide, silicon powder, yellow iron oxide, sulfide pigment, nitroso pigment, nitro pigment, azo lake pigment, lake pigment, phthalocyanine pigment, threne pigment and quinacridone pigment according to the wavelength of a laser beam in use, besides titanium dioxide.

Figure 23:
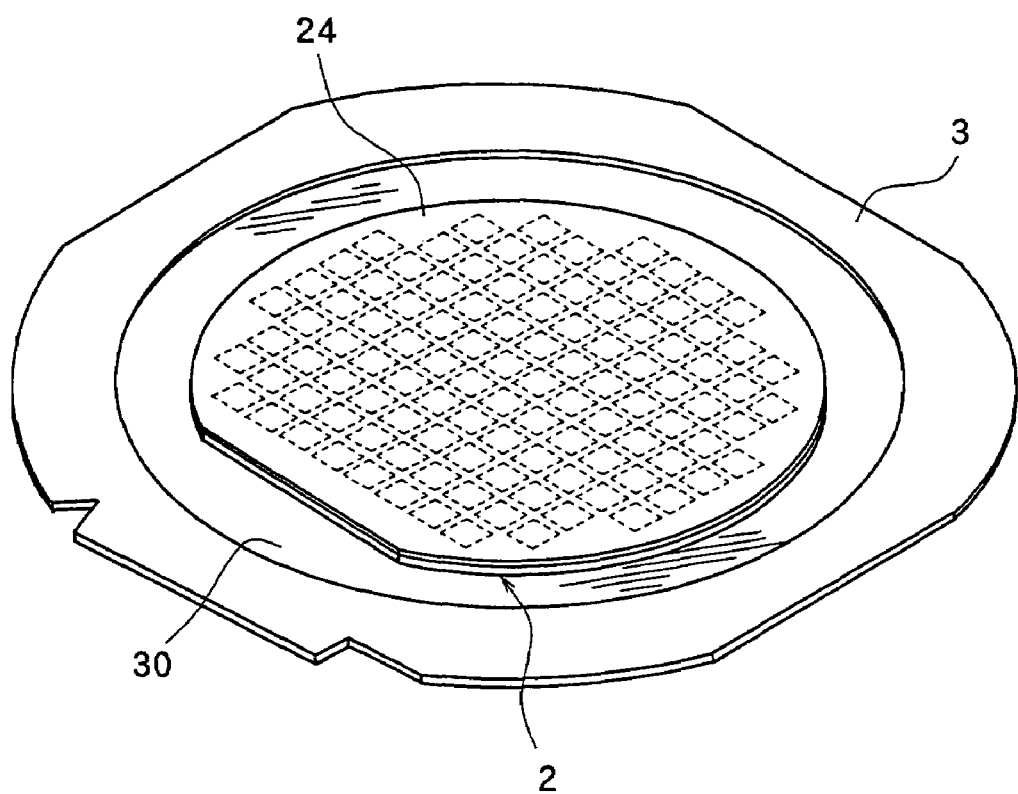
FIG. 23 is a perspective view of the semiconductor wafer coated with the resin film which is supported to the annular frame via the protective tape.

After the resin film 24 is formed on the front surface 2a of the semiconductor wafer 2 by carrying out the above resin film forming step, the back surface of the semiconductor wafer 2 is put on the protective tape 30 mounted onto the annular frame 3 as shown in FIG. 23. Therefore, the resin film 24 formed on the front surface of the semiconductor wafer 2 faces up.

After the semiconductor wafer 2 is put on the protective tape 30 mounted onto the annular frame 3, next comes the laser beam application step shown in FIGS. 8 to 10.

Figure 24:
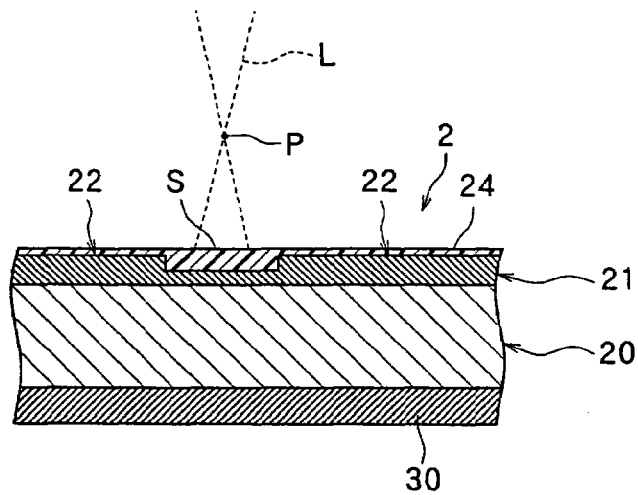
FIG. 24 is an explanatory diagram showing a laser beam application position in a further embodiment of the laser beam application step of the wafer processing method of the present invention.
Figure 25:
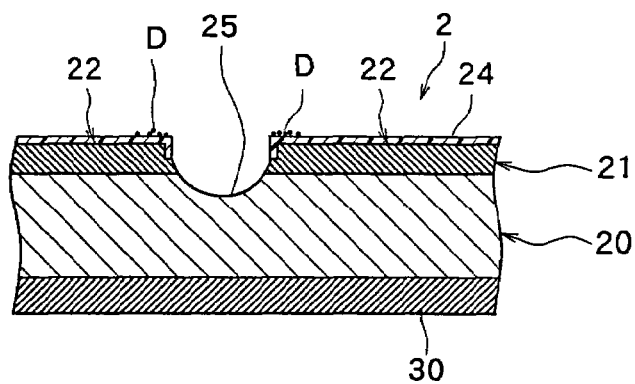
FIG. 25 is an enlarged sectional view of the principal section of the semiconductor wafer, showing a laser groove formed in the semiconductor wafer by the laser beam application step in the wafer processing method of the present invention.

In the laser beam application step of this embodiment, a pulse laser beam L is applied to the laminate 21 forming the streets 23 through the resin film 24 as shown in FIG. 24. Since the resin film 24 has the property of absorbing the laser beam L, the resin film 24 becomes a processing start point and then, the laminate 21 and the semiconductor substrate 20 are processed by the application of the pulse laser beam L to form a laser groove 25 along the streets 23 of the semiconductor wafer 2 as shown in FIG. 25. As the laser beam application step is carried out in the same manner as the laser beam application step shown in FIGS. 8 to 10, debris do not adhere to the unprocessed area. The debris D which are produced when the laminate 21 and the semiconductor substrate 20 are processed by the application of the pulse laser beam L and scattered over the processed area adhere to the surface of the resin film 24 but not to the semiconductor chips 22, as shown in FIG. 25.

Figure 26:
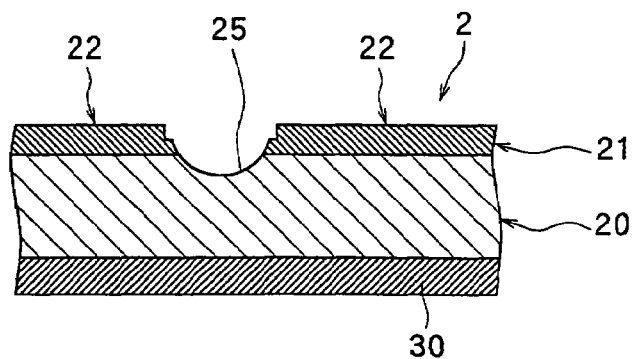
FIG. 26 is an enlarged sectional view of the principal section of the semiconductor wafer, showing that the resin film formed on the front surface of the semiconductor wafer is removed by the resin film removing step in the wafer processing method of the present invention.

After the laser beam application step is carried out as described above, next comes the step of removing the resin film 24 formed on the front surface 2a of the semiconductor wafer 2. In this resin film removing step, as the resin film 24 is formed from a water-soluble resin as described above, the resin film 24 can be washed away with water as shown in FIG. 26. On this occasion, the debris D that are produced in the above laser beam application step and adhere to the surface of the resin film 24 is also flushed away together with the resin film 24. Since the resin film 24 is made of a water-soluble resin in the illustrated embodiment, it can be washed away with water. Therefore, it is extremely easy to remove the resin film 24.

The step of cutting the semiconductor wafer 2 along the laser grooves 25 formed in the streets 23 of the semiconductor wafer 2 follows the above resin film removing step. This cutting step is carried out in the same manner as the cutting step shown in FIGS. 12 to 14.

Figure 28:
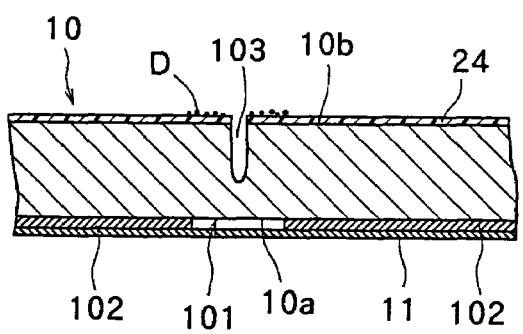
FIG. 28 is an enlarged sectional view of the principal section of an optical device wafer, showing a laser groove formed in the optical device wafer by the laser beam application step in the wafer processing method of the present invention.
Figure 29:
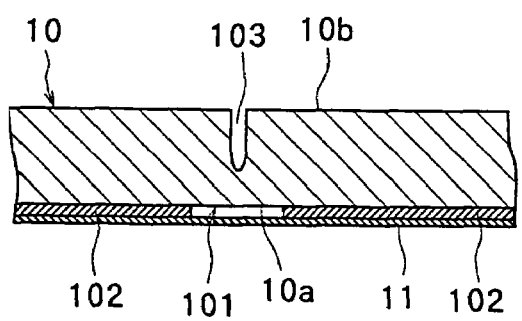
FIG. 29 is an enlarged sectional view of the principal section of the semiconductor wafer, showing that the resin film formed on the front surface of the semiconductor wafer is removed by the resin film removing step in the wafer processing method of the present invention.

A description will be subsequently given of still another embodiment of the wafer processing method of the present invention with reference to FIGS. 27 to 29. In this embodiment, the step of forming a resin film which absorbs a laser beam on the back surface 10b that is the processing surface of the optical device wafer 10 is carried out before the laser beam application step in the embodiment shown in FIGS. 15 to 20. This resin film forming step may be the same as the resin film forming step shown in FIG. 21. In this laser beam application step, as shown in FIG. 27, the focusing point P of the pulse laser beam L applied from the condenser 424 is set to the back surface 10b (top surface) of the optical device wafer 10.

Figure 27:
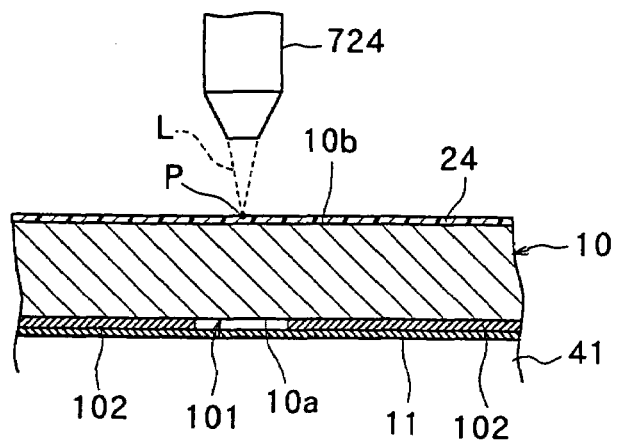
FIG. 27 is an explanatory diagram showing the laser beam application position in a further embodiment of the laser beam application step of the wafer processing method of the present invention.

In the above laser beam application step, as shown in FIG. 27, the pulse laser beam L is applied to the optical device wafer 10 through the resin film 24. Since the resin film 24 has the property of absorbing the laser beam L, the resin film 24 becomes a processing start point and then, the optical device wafer 10 is processed by the application of the pulse laser beam L to form a laser groove 103 along the streets 101 from the back surface 10b of the optical device wafer 10 as shown in FIG. 28. As the laser beam application step is carried out in the same manner as the laser beam application step shown in FIGS. 16 to 18, debris do not adhere to the unprocessed area. Meanwhile, the debris D that are produced when the optical device wafer 10 is processed by the application of the pulse laser beam L and scattered over the processed area adhere to the surface of the resin film 24 but not to the back surface 10b of the optical device wafer 10, as shown in FIG. 28.

After the laser beam application step is carried out along all the streets 101 formed on the optical device wafer 10, next comes the above-described step of removing the resin film 24 formed on the back surface 10b of the optical device wafer 10. By carrying out this resin film removing step, the resin film 24 formed on the back surface 10b of the optical device wafer 10 and the debris that are produced in the above laser beam application step and adhere to the resin film 24 are removed, as shown in FIG. 29.

The step of dividing the optical device wafer 10 along the laser grooves 103 formed in the streets 101 comes after the above resin film removing step. This dividing step may be the same as the dividing step shown in FIG. 20.

While the present invention has been described based on embodiments in which the semiconductor wafer and the optical device wafer are divided, the present invention can be applied to the laser processing of other types of wafers.

What is claimed is:

1. A wafer processing method for carrying out processing by applying a laser beam along streets formed on a wafer, comprising:
    applying a coverged laser beam to be incident at a predetermined inclination angle on one side of processing surface of the wafer to divide it into individual chips,
    processing-feeding the laser beam along a street from one end of the street toward the other end of the street at an acute angle to the processing surface of the wafer,
    applying a converged laser beam to be incident at a predetermined inclination angle on the opposite side of the normal line to the processing surface of the wafer, and
    processing-feeding the laser beam along a street from the other end of the street toward the one end of the street at an acute angle to the processing surface of the wafer.

2. The wafer processing method according to claim 1, wherein the incident angle is set to 15 to 80° C.

3. A wafer processing method for carrying out processing by applying a laser beam along streets formed on a wafer, comprising a step of applying a laser beam at an incident angle of a predetermined inclination angle to a normal line to a processing surface of the wafer while the wafer is processing-fed along a street from one end toward the other end on the side of the laser beam application at an acute angle to the processing surface of the wafer to divide it into individual chips, wherein a step of forming a film of a resin that is dissolved in a solvent, on the processing surface of the wafer is carried out before the laser beam application step, and further wherein a step of dissolving the resin film formed on the processing surface of the wafer in a solvent to remove it is carried out after the laser beam application step.

4. The wafer processing method according to claim 3, wherein the resin film is formed of a water-soluble light absorbing resin prepared by mixing a water-soluble resin with a light absorbing agent.

* * * * *